(12) United States Patent
Jain et al.

(10) Patent No.: US 8,354,866 B2
(45) Date of Patent: Jan. 15, 2013

(54) PLL START-UP CIRCUIT

(75) Inventors: Vinod K. Jain, Noida (IN); Anand K. Sinha, Noida (IN); Sanjay Kumar Wadhwa, Noida (IN)

(73) Assignee: Freescale Semiconductor, Inc., Austin, TX (US)

( * ) Notice: Subject to any disclaimer, the term of this patent is extended or adjusted under 35 U.S.C. 154(b) by 239 days.

(21) Appl. No.: 12/954,625

(22) Filed: Nov. 25, 2010

(65) Prior Publication Data
US 2012/0133405 A1 May 31, 2012

(51) Int. Cl.
*H03L 7/00* (2006.01)
(52) U.S. Cl. .................... 327/142; 327/156; 327/147
(58) Field of Classification Search .................. 327/147, 327/156, 142
See application file for complete search history.

(56) References Cited

U.S. PATENT DOCUMENTS

| | | | |
|---|---|---|---|
| 5,687,201 A | 11/1997 | McClellan | |
| 5,874,863 A | 2/1999 | Wojewoda | |
| 6,407,600 B1 | 6/2002 | Lu | |
| 6,525,612 B2 * | 2/2003 | Aoki | 327/156 |
| 6,919,769 B2 | 7/2005 | Lim | |
| 6,922,047 B2 | 7/2005 | Knoll | |
| 7,078,977 B2 | 7/2006 | Maneatis | |
| 7,095,287 B2 | 8/2006 | Maxim | |
| 7,135,934 B2 | 11/2006 | Sanchez | |
| 7,365,581 B2 | 4/2008 | Shi et al. | |
| 7,391,271 B2 | 6/2008 | Cranford, Jr. et al. | |
| 7,466,174 B2 * | 12/2008 | Tirumalai et al. | 327/156 |
| 7,515,003 B2 | 4/2009 | Park | |
| 7,656,988 B2 * | 2/2010 | Mai | 375/376 |
| 7,809,345 B2 | 10/2010 | May | |
| 2008/0218229 A1 | 9/2008 | Cranford et al. | |
| 2008/0265958 A1 | 10/2008 | Beaulaton | |
| 2010/0164569 A1 | 7/2010 | Bode | |
| 2010/0271137 A1 | 10/2010 | Kythakyapuzha | |
| 2010/0271138 A1 | 10/2010 | Thakur | |

OTHER PUBLICATIONS

J. Manealis, Low-Jitter Process-Independent DLL and PLL based on self-biased techniques, IEEE Journal of Solid State Circuits, vol. 31, pp. 1723-1732, Nov. 1996.
Stefanos Sidiropoulos et al., Adaptive Bandwidth DLLs and PLLs using Regulated Supply CMOS Buffers, 2000.
Yu-Jen Lai et al., An Agile VCO Frequency Calibration Technique for a 10-GHz CMOS PLL, IEEE Journal of Solid State Circuits vol. 42, No. 2, Feb. 2007.

* cited by examiner

*Primary Examiner* — Hai L Nguyen
(74) *Attorney, Agent, or Firm* — Charles Bergere

(57) ABSTRACT

A start-up circuit for a PLL includes a phase-frequency detector (PFD), one or more logic gates, a flip-flop and a false detection circuit. The false detection circuit includes a set of series connected flip-flops. The PFD receives a reference signal and a feedback signal. The PFD compares the frequency of a reference signal with that of a feedback signal. If the frequency of the reference signal is greater than the frequency of the feedback signal then a start-up signal is generated and transmitted to the PLL. The PLL increases the frequency of the feedback signal until it is greater than the frequency of the reference signal. The generation of the start-up signal is halted when the frequency of the feedback signal is greater than the frequency of the reference signal.

9 Claims, 7 Drawing Sheets

US 8,354,866 B2

PLL START-UP CIRCUIT

BACKGROUND OF THE INVENTION

The present invention relates to a phase locked loop, and more specifically to a start-up circuit for a phase locked loop.

Recent years have seen advancements in the field of electronic circuits and communication systems. Phase locked loops (PLLs) are an integral part of these circuits and systems. A PLL is used to generate an oscillating signal based on a reference signal. The oscillating signal is used for modulation and demodulation of a message signal in communication systems. The oscillating signal also is used in electronic circuits as a clock signal for synchronous operations within the circuit.

A PLL includes a voltage controlled oscillator (VCO). The VCO requires a trigger voltage signal for initiating the generation of an output signal. The trigger voltage signal is generated by a start-up circuit connected to the PLL.

FIG. 1 is a schematic diagram of a conventional start-up circuit 100 for a PLL. The start-up circuit 100 includes a voltage source 102, a switch 106, a capacitor 108, and a VCO 110. The voltage source 102 is connected to one side of the switch 106. The switch 106 receives a start-up signal 104, generated by an external source, which controls it's switching. The other side the switch 106 is coupled to the capacitor 108 and to the VCO 110.

At start-up of the PLL (not shown), the start-up signal 104 is generated by the external source and transmitted to the switch 106 where it causes the switch 106 to a go to a conducting state. Then, a voltage signal generated by the voltage source 102 is transmitted to the VCO 110 by way of the switch 106. The VCO 110 generates an output signal based on the magnitude of the voltage signal. The frequency of the output signal depends on the magnitude of the voltage signal.

The start-up circuit 100 is switched to an OFF state after a predetermined time has elapsed. Thereafter, the PLL (not shown) begins its frequency and phase acquisition of the output signal based on a reference signal. The PLL compares the frequency of the reference signal and the output signal to generate a control voltage. The control voltage is transmitted to the VCO 110. Thereafter, the VCO 110 varies the frequency and the phase of the output signal based on the control voltage.

The start-up circuit 100 is switched to an ON state for a predetermined time by the start-up signal 104. The magnitude of the voltage signal generated by the voltage source 102 is constant. The VCO 110 generates an output signal based on the magnitude of the voltage signal generated by the voltage source 102, and the predetermined time for which the start-up circuit is in the ON state. Thus, the frequency attained by the output signal depends on the magnitude of the voltage signal and the predetermined time for which the start-up signal is in ON state. After switching the start-up circuit 100 to an OFF state, the PLL starts its operation of frequency and phase acquisition of the output signal based on the reference signal. The time required by the PLL to attain the frequency and phase of the output signal depends on the frequency of the output signal just before switching the start-up circuit 100 to an OFF state. Further, the frequency attained by the output signal, during the operation of the start-up circuit 100, depends on the predetermined time and the magnitude of the voltage signal generated by the voltage source 102. Thus, the time required by the PLL for frequency and phase acquisition of the output signal depends on the predetermined time for which the start-up circuit was in the ON state and the magnitude of the voltage signal generated by the voltage source 102. This leads to uncertainty concerning the response time of the PLL.

It would be advantageous to have a start-up circuit for a PLL that turns off with more certainty and more quickly either when or near to when a lock is acquired.

BRIEF DESCRIPTION OF THE DRAWINGS

The following detailed description of the preferred embodiments of the present invention will be better understood when read in conjunction with the appended drawings. The present invention is illustrated by way of example, and not limited by the accompanying figures, in which like references indicate similar elements.

DETAILED DESCRIPTION OF THE PRESENT INVENTION

Figure 1:
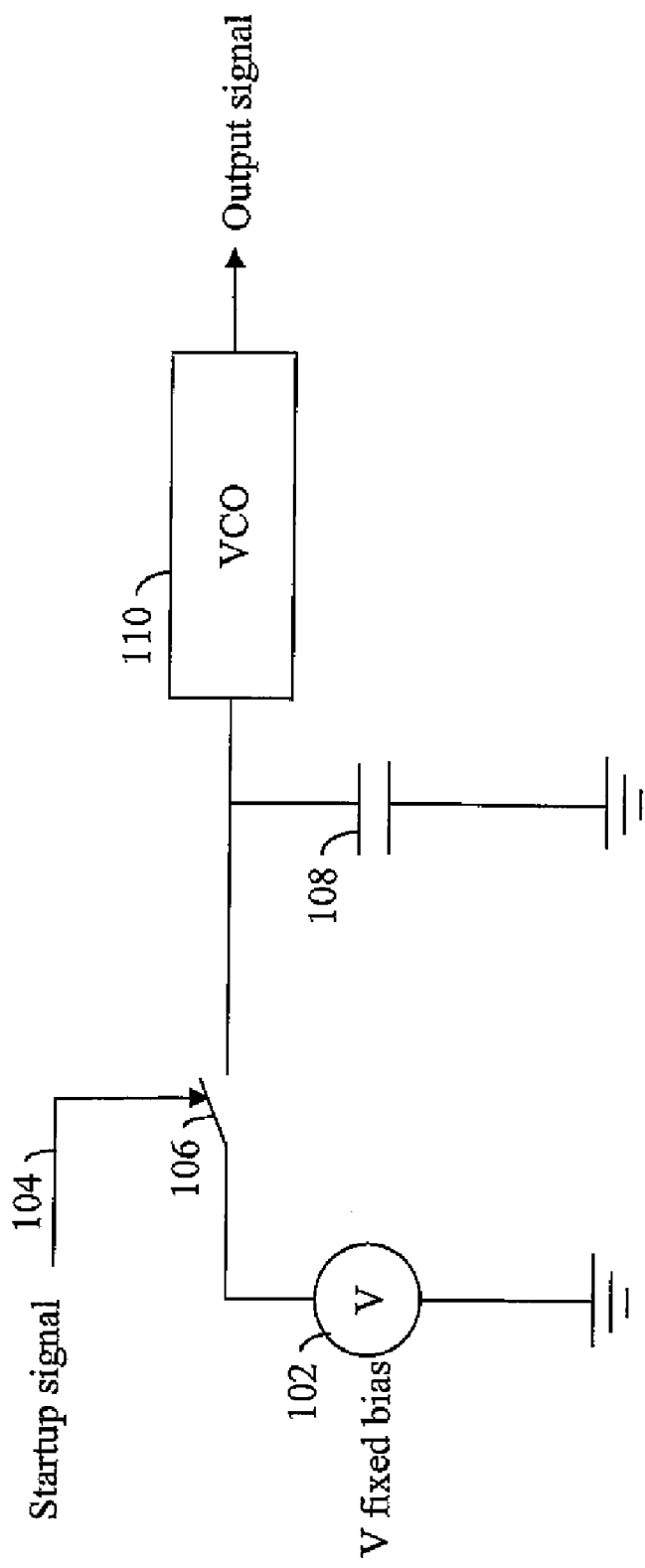
FIG. 1 is a schematic diagram of a conventional start-up circuit for a PLL.

The detailed description of the appended drawings is intended as a description of the currently preferred embodiments of the present invention, and is not intended to represent the only form in which the present invention may be practiced. It is to be understood that the same or equivalent functions may be accomplished by different embodiments that are intended to be encompassed within the scope of the present invention.

In one embodiment, a start-up circuit for a PLL is provided. The start-up circuit includes a phase-frequency detector (PFD) that receives a reference signal from an external source and a feedback signal from the PLL, where the feedback signal is the output signal of the PLL. The PFD compares the phase and frequency of the reference signal and the feedback signal to generate first and second comparison signals. The first and second comparison signals are pulse signals in which the width of the pulse of the first comparison signal is greater than the width of the second comparison signal when the frequency of the reference signal is greater than the frequency of the feedback signal. Similarly, the width of the pulse of the second comparison signal is greater than the width of the pulse of the first comparison signal when the frequency of the feedback signal is greater than that of the reference signal. The first and second comparison signals as well as a start-up signal from the start-up circuit are transmitted to one or more AND gates. The AND gates perform a logical AND operation on the first and second comparison signals to generate first and second intermediate signals. The first intermediate signal is transmitted to an input terminal of a flip-flop. The second intermediate signal is transmitted to the clock terminal of the flip-flop. The first intermediate signal is transmitted from the output terminal of the flip-flop based on the second intermediate signal. Thereafter, the first intermediate signal is transmitted to a set of flip-flops. The set of flip-flops are serially connected with each other to form a false detection circuit. The set of flip-flops receive the reference signal at their clock terminals. One flip-flop of the set of flip-flops transmits the first intermediate signal from its input terminal to the input of a subsequent flip-flop based on the reference signal. Thus, the first intermediate signal traverses the set of flip-flops based on the reference signal. Further, the first intermediate signal is transmitted to an OR gate from an output terminal of the set of flip-flops. The OR gate performs a logical OR operation on the intermediate signals received from the output terminals of each of the flip-flops of the set of flip-flops to generate the start-up signal.

In another embodiment of the present invention, a method to operate a start-up circuit for a PLL is provided. The frequency of a feedback signal and the frequency of a reference signal are compared to generate first and second comparison signals. The first and second comparison signals are pulse signals. The width of the pulse of the first comparison signal is greater than the width of the second comparison signal when the frequency of the reference signal is greater than the frequency of the feedback signal. Similarly, the width of the pulse of the second comparison signal is longer when the frequency of the feedback signal is greater than that of the reference signal. A start-up signal is generated based on the first and second comparison signals. The start-up signal is transmitted to the PLL for increasing the frequency of the feedback signal. If the frequency of the feedback signal is greater than the frequency of the reference signal then the generation of the start-up signal is halted. Thereafter, the PLL acquires the phase and frequency of the output signal based on the reference signal.

Various embodiment of the present invention provide a system and a method for operating a start-up circuit for a phase locked loop (PLL). The system receives a reference signal from an external source and a feedback signal from the PLL, where the feedback signal is the output signal of the PLL. The start-up circuit includes a phase-frequency detector (PFD) that receives the feedback signal and the reference signal. The PFD compares the phase and frequency of the reference signal and the feedback signal to generate first and second comparison signals, which are pulse signals. The width of the pulse of the first comparison signal is greater than the width of the pulse of the second comparison signal when the frequency of the reference signal is greater than the frequency of the feedback signal and vice-versa. The first and second comparison signals are transmitted to one or more AND gates. The one or more AND gates receive a start-up signal from the output terminal of the start-up circuit and perform a logical AND operation on the first and second comparison signals to generate first and second intermediate signals. The first intermediate signal is transmitted to an input terminal of a flip-flop. The second intermediate signal is transmitted to the clock terminal of the flip-flop. The first intermediate signal is output from the output terminal of the flip-flop based on the second intermediate signal. Thereafter, the first intermediate signal is transmitted to a set of flip-flops. The set of flip-flops are serially connected with each other to form a false detection circuit. The set of flip-flops receive the reference signal at their clock terminals. One of the flip-flops of the set of flip-flops transmits the first intermediate signal from its input terminal to the input terminal of the subsequent flip-flop, based on the reference signal. Thus, the intermediate signal traverses the set of flip-flops based on the reference signal. Further, the intermediate signals from the output terminals of the set of flip-flops are transmitted to an OR gate. The OR gate performs a logical OR operation on the intermediate signals to generate the start-up signal. The start-up signal is transmitted to the PLL. The PLL, on receiving the start-up signal, increases the frequency of the feedback signal until the frequency of the feedback signal is greater than the frequency of the reference signal. If the frequency of the feedback signal is greater than the frequency of the reference signal, then the generation of the start-up signal is halted. Thereafter, the PLL begins frequency and phase acquisition of the output signal based on the reference signal.

As discussed above, a start-up signal is generated based on the first and second comparison signals generated by the PFD. The first and second comparison signals are based on a comparison of the frequency of the reference signal and the feedback signal. Thus, the generation of the start-up signal is dependent on the frequency of the feedback signal and the reference signal irrespective of the time and magnitude of the voltage signal used in the conventional start-up circuit. This reduces the uncertainty of the response time of the PLL circuit. Further, the generation of the start-up signal is halted when the frequency of the feedback signal is greater than the frequency of the reference signal. Thus, time required by the PLL to achieve the phase and frequency lock, subsequent to halting the generation of the start-up signal, is less than the time required by conventional start-up circuits for PLL systems.

Figure 2:
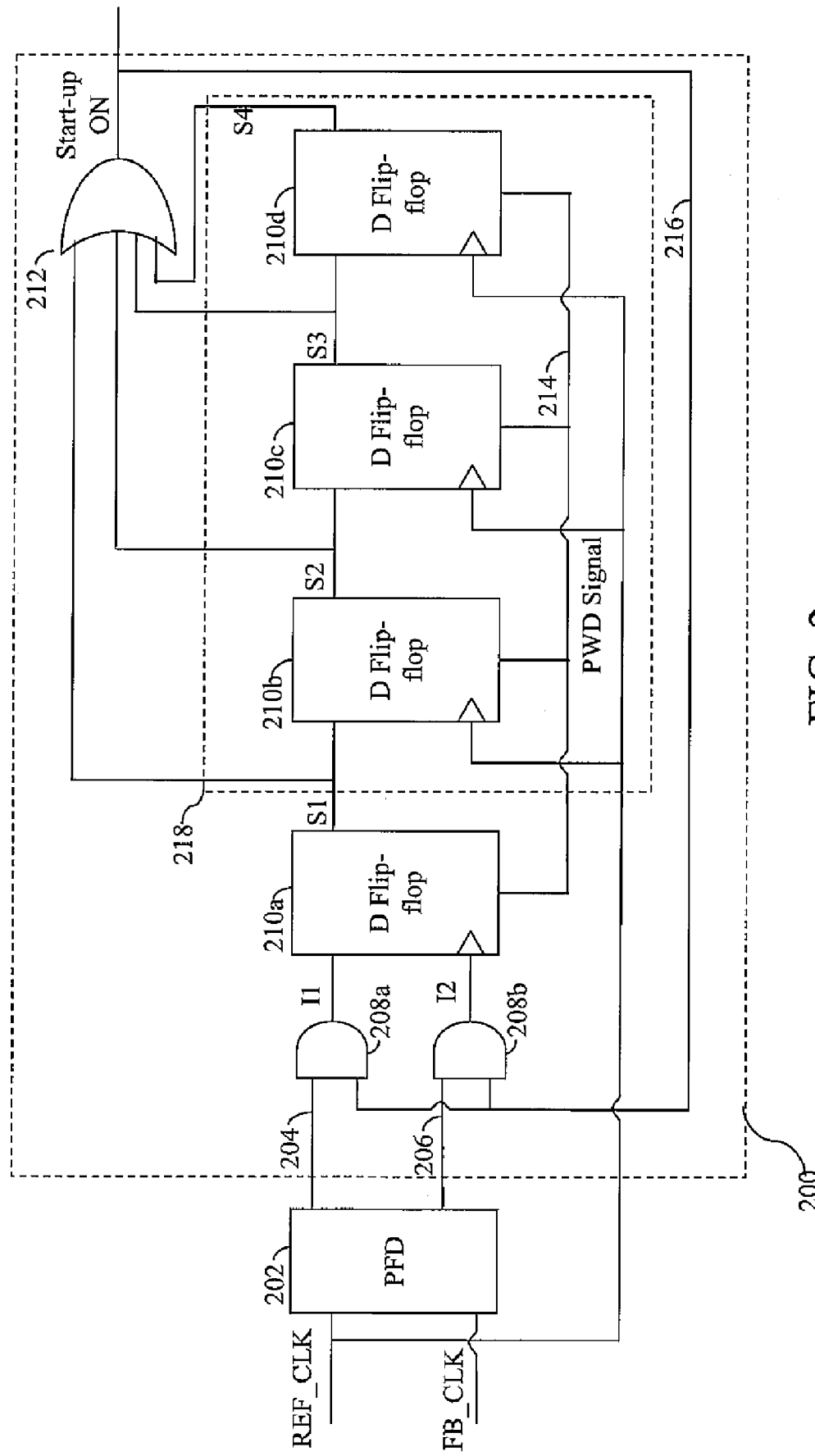
FIG. 2 is a schematic diagram of a start-up circuit for a PLL in accordance with one embodiment of the present invention.

Referring now to FIG. 2, a schematic circuit diagram of a start-up circuit 200 for a PLL in accordance with an embodiment of the present invention is shown. The start-up circuit 200 includes AND gates 208a, 208b, a flip-flop 210a, a false detection circuit 218 and an OR gate 212. The false detection circuit 218 includes flip-flops 210b, 210c and 210d. The start-up circuit 200 is connected to a phase-frequency detector (PFD) 202.

The PFD 202 is connected to the AND gates 208a and 208b. The PFD 202 receives a reference signal and a feedback signal. The output terminal of the AND gate 208a is connected to the input terminal of the flip-flop 210a. The output terminal of the AND gate 208b is connected to the clock terminal of the flip-flop 210a. The output terminal of the flip-flop 210a is connected to the input terminal of the flip-flop 210b. Further, the output terminal of the flip-flop 210a is connected to the OR gate 212. The flip-flops 210b, 210c, and 210d are connected serially with each other, i.e., the output terminal of the flip-flop 210b is connected to the input terminal of the flip-flop 210c and so forth. The serially connected flip-flops 210b, 210c, and 210d form the false detection circuit 218. The false detection circuit 218 or the set of serially connected flip-flops have been used so that any false indication of feedback frequency becoming greater than reference frequency due to noise, etc. can be avoided. In the embodiment shown, three series connected flip-flops have been used. Unless the feedback frequency is higher than the reference frequency for three consecutive cycles, the generation of the start-up signal is not halted. As will be understood by those of skill in the art, the number of flip-slops can be increased for further noise immunity.

Further, the output terminals of the flip-flops 210b, 210c, and 210d are connected to the OR gate 212. The output terminal of the OR gate 212 is connected to the PLL (not shown). Further, the output terminal of the OR gate 212 is connected to the AND gates 208a, 208b.

Figure 3:
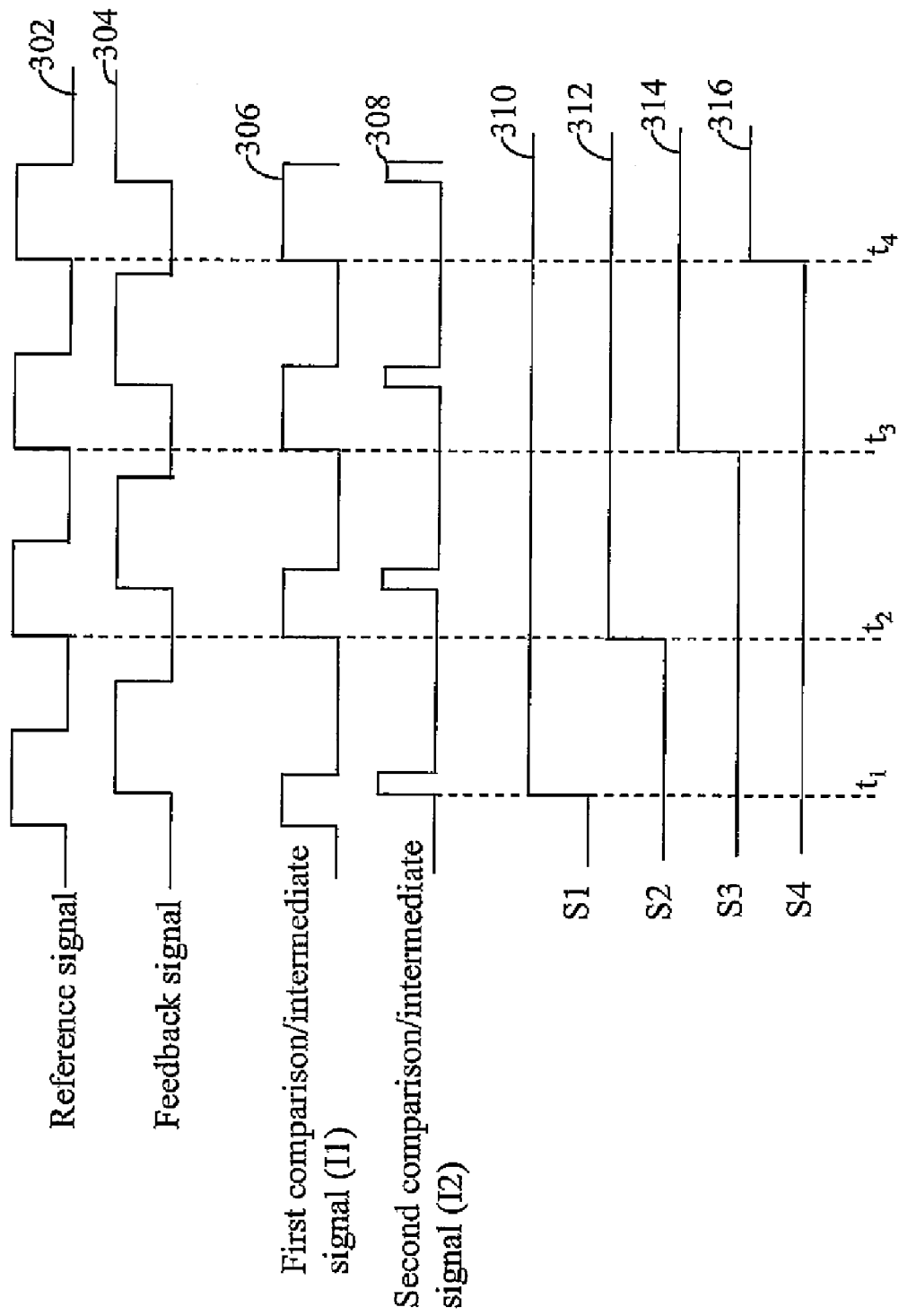
FIGS. 3 and 4 are timing diagrams of the start-up circuit of FIG. 2.

The operation of the start-up circuit 200 now will be explained in more detail with reference to FIG. 3, which is a timing diagram for the start-up circuit 200. The operation of the start-up circuit 200 also will be explained in more detail with reference to FIG. 4 when the frequency of the reference signal is less than the frequency of the feedback signal.

At the start-up of the PLL, a PWD signal 214, generated by an external source, is transmitted to the start-up circuit 200. The PWD signal 214 is provided to the set terminals of the flip-flops 210a, 210b, 210c and 210d, and the output of the flip-flops 210a, 210b, 210c and 210d is set to 'active high' by the PWD signal 214 at start-up. The output of the flip-flops 210a, 210b, 210c and 210d is transmitted to the OR gate 212. The OR gate 212 performs a logical OR operation to generate the start-up signal. Since, the output of the flip-flops 210a, 210b, 210c and 210d is 'active high', the start-up signal is 'active high' at the start-up of the PLL. In an alternative embodiment, the start-up signal can be 'active low'. In an active low design, the first and second AND gates 208a and 208b could be replaced with OR gates and the OR gate 212 replaced with an AND gate. However, as will be understood by those of skill in the art, many alternative logic gates may be used to implement the same functions, such as using NAND gates, NOR gates, NOT gates, etc. The start-up signal is transmitted to the AND gates 208a and 208b and to the PLL (not shown) for starting the PLL.

The PFD 202 receives a feedback signal (waveform 304) and a reference signal (waveform 302). The PFD 202 compares the frequencies of the reference signal and the feedback signal to generate a first comparison signal 204 (waveform 306) and a second comparison signal 206 (waveform 308). In this embodiment, the first and second comparison signals 204, 206 are pulse signals. The width of the pulse of the first comparison signal 204 is greater than the width of the second comparison signal 206 when the frequency of the reference signal is greater than the frequency of the feedback signal, as shown in FIG. 3 with waveforms 306, 308. The first and second comparison signals 204, 206 are transmitted to the AND gates 208a, 208b respectively. The AND gates 208a, 208b receive the start-up signal from the output terminal of the OR gate 212. As discussed above, the start-up signal is 'active high' at the start-up of the start-up circuit 200. Thus, the first and second comparison signals 204, 206 are transmitted to the output terminals of the AND gates 208a, 208b respectively. The output of the AND gates 208a, 208b are referred to as intermediate signals I1 and I2 (waveforms 306 and 308). The first and second intermediate signals I1 and I2 are transmitted to the flip-flop 210a. The flip-flops 210a, 210b, 210c and 210d are positive edge triggered. In another embodiment, the flip-flops 210a, 210b, 210c, and 210d may be negative edge triggered or level triggered. At time $t_1$, the positive edge of the intermediate signal I2 is received at the clock terminal of the flip-flop 210a. Thus at time $t_1$ the first intermediate signal I1 is transmitted to the output terminal of the flip-flop 210a as signal S1. At time $t_1$, the first intermediate signal I1 is 'active high'. Thus the signal S1, depicted by waveform 310, is 'active high'. The signal S1 is transmitted to the OR gate 212 and to the false detection circuit 218. The false detection circuit 218 includes the flip-flops 210b, 210c, and 210d. The false detection circuit 218 is shown to include three flip flops as an example, but, as previously discussed, may comprise more than three flip-flops or just two flip-flops. The flip-flops 210b, 210c, and 210d are connected serially with each other. The output terminals of the flip-flops 210b, 210c, and 210d are connected to the OR gate 212. The flip-flops 210b, 210c, and 210d receive the reference signal at their clock terminals. The flip-flop 210b receives signal S1 from the flip-flop 210a. At time $t_2$ the flip-flop 210b receives the positive edge of the reference signal (waveform 302). The flip-flop 210b transmits the signal S1 at its output terminal as signal S2 upon receiving a positive edge of the reference signal. The signal S2 is transmitted to the input terminal of the flip-flop 210c. At time $t_3$ the flip-flop 210c receives the positive edge of the reference signal and transmits the signal S2 to its output terminal as signal S3 upon receiving a positive edge of the reference signal. Similarly the signal S4 is generated from signal S3 by the flip-flop 210d based on the positive edge of the reference signal. Thus, the signals S1, S2, S3, and S4 are delayed versions of the first intermediate signal I1. The signals S1, S2, S3, and S4 are transmitted to the OR gate 212, which performs a logical OR operation on the signals S1, S2, S3, and S4 to generate the start-up signal. Since the first intermediate signal I1 is 'active high', at time $t_1$, the signal S1 is 'high' at time $t_1$, as shown in FIG. 3 with waveform 310. The 'active high' signal S1 generates 'active high' signal S2 in next positive edge (time $t_2$) and so forth. The signals S1, S2, S3 and S4 are transmitted to the OR gate 212, which performs an OR operation on the signals S1, S2, S3, and S4. The signals S1, S2, S3 and S4 are 'active high', subsequent to times $t_1$, $t_2$, $t_3$, and $t_4$ respectively. Since, the output of the OR gate 212 is 'high' if any one of signals at its input terminals is 'high', the start-up signal generated by the OR gate 212 is 'high' at times $t_1$, $t_2$, $t_3$, and $t_4$.

Figure 4:
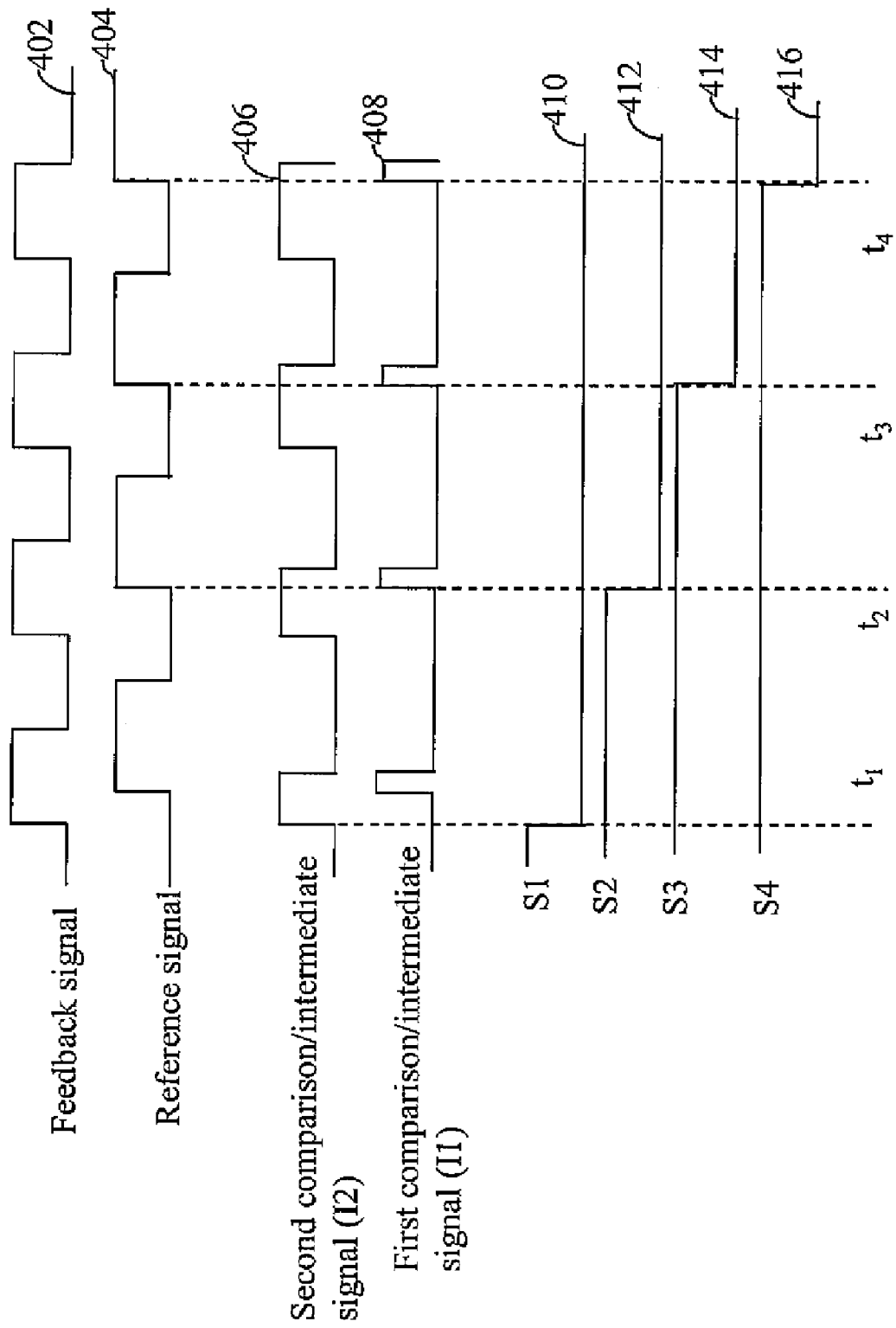

The case where the frequency of the feedback signal is greater than the frequency of the reference signal is depicted in FIG. 4. Waveforms 402 and 404 depict the feedback and reference signals, respectively. The width of the pulse of the first intermediate signal I1 is less than the width of the pulse of the second intermediate signal I2, depicted by the waveforms 408 and 406 respectively. At time $t_1$, positive edge of the second intermediate signal I2 is received at the clock terminal of the flip-flop 210a. Thus at time $t_1$ the intermediate signal I1 is transmitted to the output terminal of the flip-flop 210a as signal S1. At time $t_1$ the first intermediate signal I1 is low. Thus the signal S1 410 is low. The signal S1 is transmitted to the OR gate 212 and to the false detection circuit 218. The signal S1 is provided to the flip-flop 210b. The flip-flop 210b receives the positive edge of the reference signal at time $t_2$, depicted by the waveform 404. The flip-flop 210b transmits the signal S1 at its output terminal, to generate a signal S2, at time $t_2$. Further, the signal S2 is transmitted to the input terminal of the flip-flop 210c. The flip-flop 210c receives the positive edge of the reference signal at time $t_3$, depicted by the waveform 404. The flip-flop 210c transmits the signal S2 to its output terminal as signal S3, at time $t_3$. Similarly the signal S4 is generated from signal S3 by the flip-flop 210d on the positive edge of the reference signal. The signals S1, S2, S3, and S4 are transmitted to the OR gate 212. The OR gate 212 performs an OR logic operation on the signals S1, S2, S3, and S4 to generate the start-up signal. Since the first intermediate signal I1 is low at time $t_1$, the signal S1 is low at time $t_1$. The low signal S1 generates low signal S2 at subsequent time $t_2$ and so forth. Signals S1, S2, S3 and S4 are transmitted to the OR gate 212, which performs a logical OR operation on the signals S1, S2, S3, and S4. The signals S1, S2, S3 and S4 are low at times $t_1$, $t_2$, $t_3$, and $t_4$ respectively. Since the OR gate 212 generates an 'active low' signal only when all the signals at its input terminals are low, the start-up signal generated by the OR gate 212 is low subsequent to time $t_4$.

As discussed above, the start-up signal is generated by the start-up circuit 200 when the frequency of the reference signal is greater than the frequency of the feedback signal. The start-up signal is transmitted to the PLL, which, in response, increases the frequency of the output signal, i.e., the feedback signal. The generation of the start-up signal is halted when the frequency of the feedback signal is greater than the frequency of the reference signal. Thereafter, the PLL acquires the phase and frequency of an output signal based on the reference signal. Since the generation of the start-up signal is dependent on the frequency of the feedback signal and the reference signal, the uncertainty of the response time of the PLL is reduced. Further, the generation of the start-up signal is halted when the frequency of the feedback signal is greater than the frequency of the reference signal. Thus the time required by the PLL for acquisition of the phase and frequency based on the reference signal is reduced as compared to the time required by conventional systems.

Figure 5:
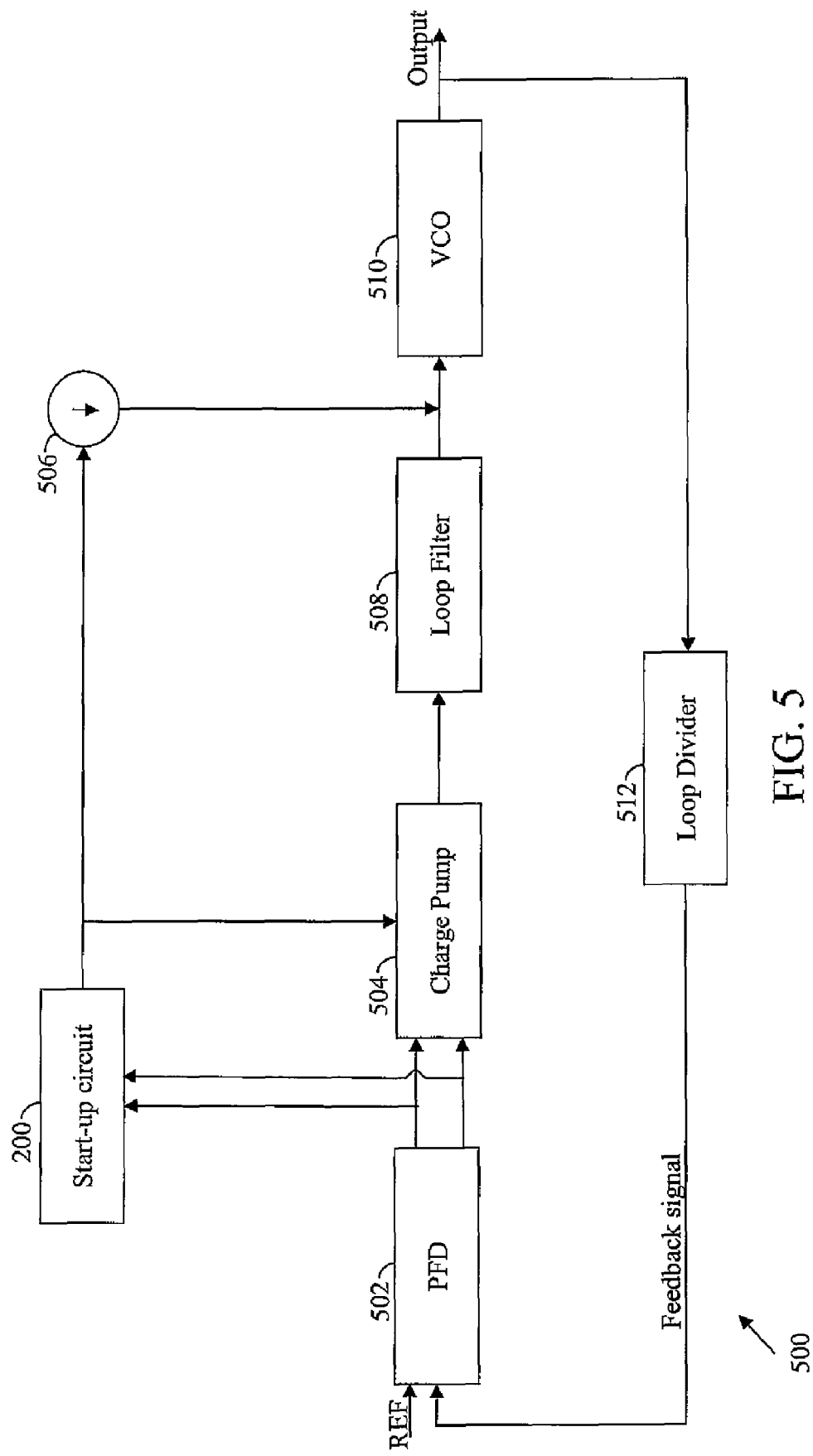
FIG. 5 is a schematic diagram of the start-up circuit of FIG. 2 being used with an analog PLL in accordance with an embodiment of the present invention.

FIG. 5 is a schematic circuit diagram of an analog phase locked loop (APLL) 500 incorporating the start-up circuit 200 in accordance to an embodiment of the present invention. The APLL 500 includes a phase-frequency detector (PFD) 502, the start-up circuit 200, a charge pump 504, a current source 506, a loop filter 508, a voltage controlled oscillator (VCO) 510, and a loop divider 512.

The PFD 502 is connected to the charge pump 504 and to the start-up circuit 200. The start-up circuit 200 is connected to the charge pump 504 and the current source 506. The charge pump 504 is connected to the loop filter 508. The current source 506 and the loop filter 508 are connected to the VCO 510. The VCO 510 generates an output signal. The VCO 510 also is connected to the loop divider 512, which generates a feedback signal that is provided as an input to the PFD 502.

At start-up of the APLL 500, the start-up circuit 200 generates a start-up signal. The start-up signal is transmitted to the charge pump 504 and to the current source 506. The start-up signal turns the charge pump 504 OFF. That is, the start up signal acts as a reset (or power down) signal for the charge pump 504, so when the start-up signal is active, the charge pump 504 is in an OFF state and the control voltage is charged through the current source 506. When the start-up signal goes to inactive, the charge pump 504 begins functioning and the APLL 500 operates with a normal charge pump feedback loop.

The current source 506 generates the start-up current signal on receiving the start-up signal. The start-up current signal is transmitted to the loop filter 508, which pulls the control voltage; and the VCO 510 generates the output signal based on the control voltage. The frequency of the output signal generated by the VCO 510 depends only on the control voltage. The output signal is transmitted to the loop divider 512. The loop divider 512 divides the frequency of the output signal by a predetermined factor to generate a feedback signal and the feedback signal is transmitted to the PFD 502. The PFD also receives a reference signal, generated by an external source, and compares the frequency and the phase of the reference signal with those of the feedback signal to generate first and second comparison signals. The first and second comparison signals are transmitted to the start-up circuit 200 and the start-up current signal is transmitted to the loop filter 508, which as previously discussed, pulls the control voltage. The above-described process continues until the frequency of the feedback signal is greater than the frequency of the reference signal.

Subsequent to the frequency of the feedback signal being greater than the frequency of the reference signal, the generation of the start-up signal is halted, which will switch OFF the current source 506 and switch ON the charge pump 504. Thereafter, the PFD 502 compares the frequency and the phase of the reference signal with the frequency and phase of the feedback signal to generate first and second comparison signals. The first and second comparison signals are transmitted to the start-up circuit 200 and to the charge pump 504. The charge pump 504 varies the control voltage based on the first and second comparison signals and the varied control voltage is transmitted to the VCO 510. The VCO 510 generates the output signal based on the control voltage generated from the charge pump 504.

Figure 6:
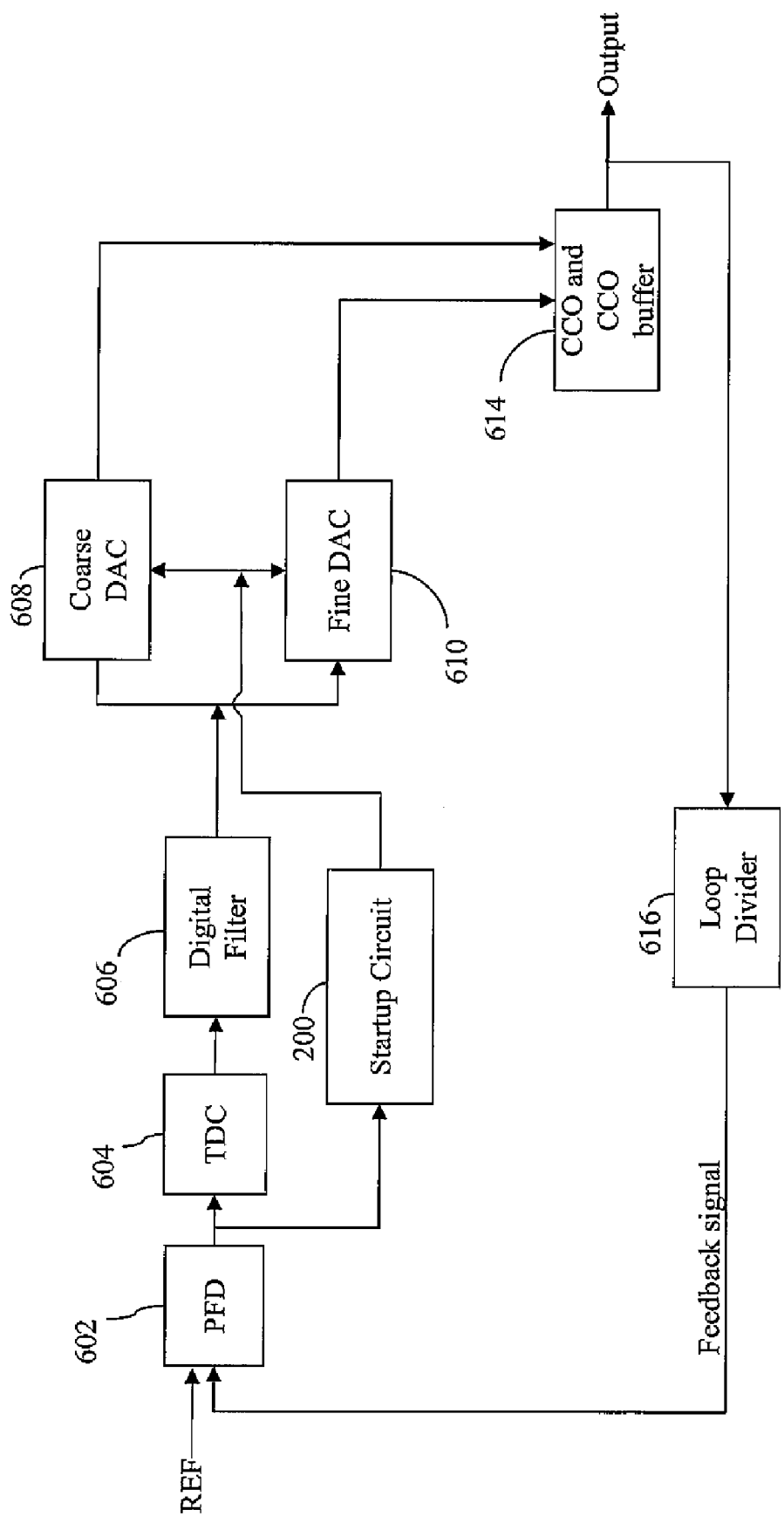
FIG. 6 is a schematic diagram of the start-up circuit of FIG. 2 being used with a digital PLL in accordance with an embodiment of the present invention.

FIG. 6 is a schematic circuit diagram of a digital phase locked loop (DPLL) 600 incorporating the start-up circuit 200 in accordance to an embodiment of the present invention. The DPLL 600 includes a phase-frequency detector (PFD) 602, a time to digital converter (TDC) 604, a digital filter 606, a coarse DAC 608, a fine DAC 610, a current controlled oscillator (CCO) 614, a loop divider 616, and the start-up circuit 200.

The PFD 602 is connected to the TDC 604 and the TDC 604 is connected to the digital filter 606. The digital filter 606 is connected to the coarse DAC 608 and fine DAC 610. The start-up circuit 200 also is connected to the coarse and fine DAC 608 and 610. The coarse and fine DAC 608 and 610, respectively, are connected to the CCO 614. The CCO 614 is connected to the loop divider 616 and the loop divider 616 is connected to the PFD 602.

At the start-up of the DPLL 600, the start-up circuit 200 generates a start-up signal. The start-up signal is transmitted to the coarse and fine DACs 608 and 610. It should be understood by a person skilled in the art that the coarse and fine DACs 608 and 610 include one or more current sources (not shown). The current sources of the coarse DAC 608 are binary weighted and the current sources of the fine DAC 610 are thermometrically weighted. The one or more current sources of the coarse DAC 608 are referred to herein as binary current sources, and the one or more current sources of the fine DAC 610 are referred to as thermometric current sources. On receiving the start-up signal, the coarse DAC 608 switches the binary current sources to the conducting state. The fine DAC 610, on receiving the start-up signal, switches the thermometric current sources to the conducting state. The current signals generated by the binary current sources and the thermometric current sources are transmitted to the CCO 614. In response, the CCO 614 generates an output signal based on the binary and thermometric current signals. The output signal is transmitted to the loop divider 616. The loop divider divides the frequency of the output signal by a predetermined factor to generate a feedback signal. The feedback signal is transmitted to the PFD 602. The PFD 602 receives a reference signal from an external source and compares the frequency and phase of the reference signal with the frequency and phase of the feedback signal to generate an error signal. The error signal is transmitted to the start-up circuit 200 and to the TDC 604. The TDC 604 converts the error signal to a digital error signal. The digital error signal is transmitted to the digital filter 606. The digital filter 606 attenuates the high frequency noise signal from the digital error signal and generates a control word based on the digital error signal. The control word is transmitted to the coarse DAC 608. The coarse DAC 608 switches the binary current sources based on the control word. The control word input to the fine DAC 610 is fixed at a predetermined value prior to the condition in which the frequency of the reference signal is greater than the frequency of the feedback signal. The current signals from the thermometric current sources and the binary current sources are transmitted to the CCO 614. The CCO 614 varies the output signal based on the received current signals. The above-described process continues until the frequency of the feedback signal is greater than the frequency of the reference signal.

Subsequent to a condition where the frequency of the feedback signal is greater than the frequency of the reference signal, the start-up circuit 200 halts the generation of the start-up signal. Thereafter the control word from the digital filter 606 to the coarse DAC 608 is fixed. Further, the control word input to the fine DAC 610 is varied. Thereafter, the fine DAC 610 varies the current signal, according to the control word input, for acquisition of the phase and frequency of the output signal based on the reference signal.

Figure 7:
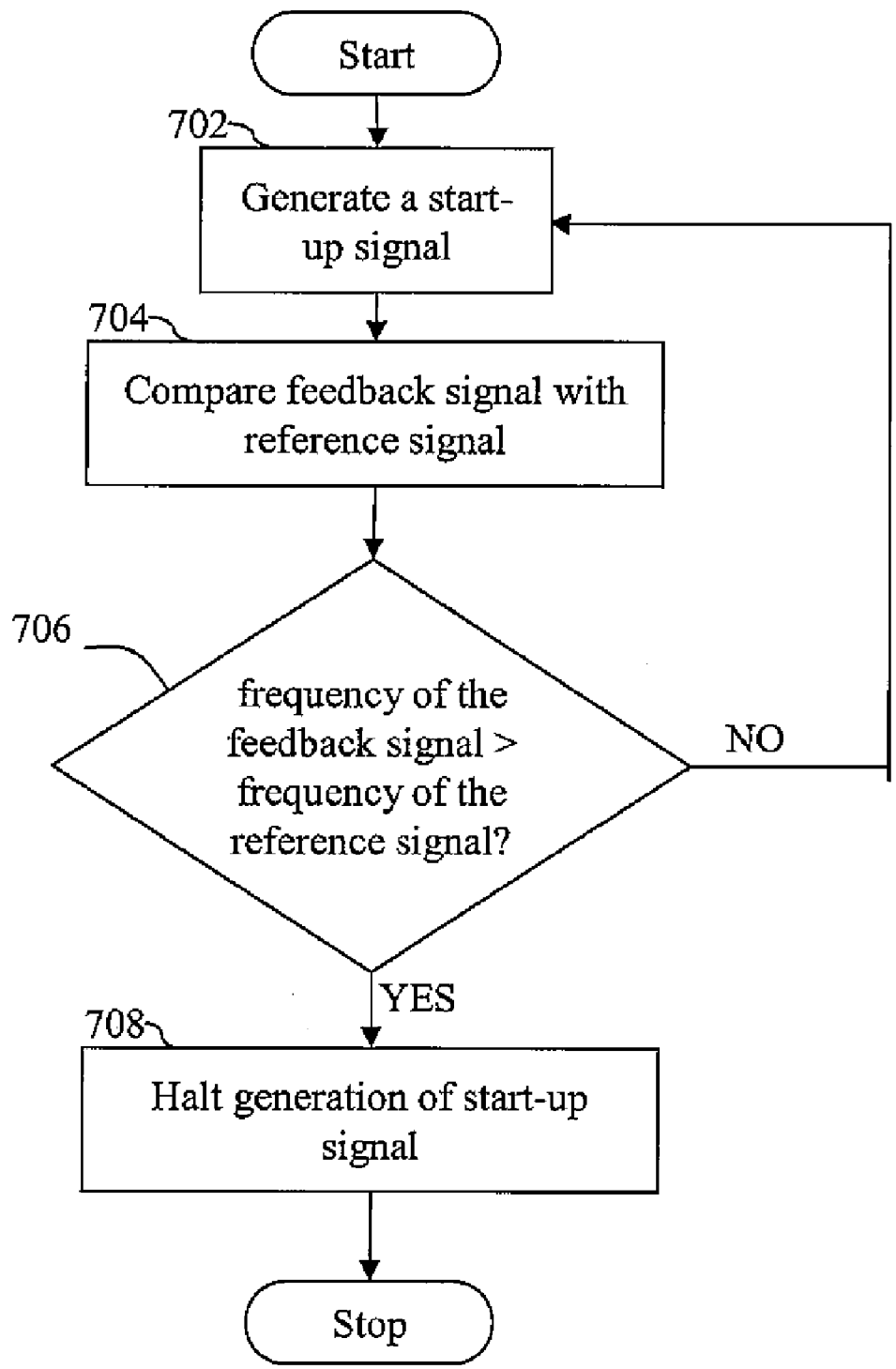
FIG. 7 is a flowchart illustrating a method of operation of the start-up circuit of FIG. 2 in accordance with an embodiment of the present invention.

FIG. 7 is a flowchart depicting the operation of a PLL system using the start-up circuit 200 in accordance with an embodiment of the present invention. The flowchart 700 will be described with reference to the APLL 500 of FIG. 5.

At step 702 a start-up signal is generated by the start-up circuit 200 and transmitted to the APLL 500. The APLL 500 generates an output signal upon receiving the start-up signal. The frequency of the output signal is reduced by a predetermined factor to generate a feedback signal. The feedback signal is transmitted to the PFD 502. The PFD 502 also receives a reference signal generated by an external source. At step 704, the reference signal and the feedback signal are compared. At step 706, a check is performed to determine whether the frequency of the feedback signal is greater than the frequency of the reference signal. If the frequency of the feedback signal is less than the frequency of the reference signal then steps 702-706 are repeated. However, if the frequency of the feedback signal is greater than the frequency of the reference signal then step 708 is performed. At step 708 the generation of the start-up signal is halted. Thereafter, the APLL 500 operates to acquire the phase and frequency of the output signal based on the reference signal.

While various embodiments of the present invention have been illustrated and described, it will be clear that the present invention is not limited to these embodiments only. Numerous modifications, changes, variations, substitutions, and equivalents will be apparent to those skilled in the art, without departing from the spirit and scope of the present invention, as described in the claims.

The invention claimed is:

1. A start-up circuit for a Phase locked loop (PLL), comprising:
   a phase-frequency detector (PFD) for comparing the frequency of a reference signal with the frequency of a feedback signal to generate first and second comparison signals, wherein the feedback signal is an output signal generated by the PLL;
   one or more AND gates, connected to the PFD, for generating first and second intermediate signals using the first and second comparison signals;
   a first flip-flop, connected to the one or more AND gates, for transmitting the first intermediate signal to the output terminal of the first flip-flop based on the second intermediate signal, wherein the first intermediate signal is received at the data input terminal of the first flip-flop and the second intermediate signal is received at the clock input terminal of the first flip-flop;
   a set of second flip-flops, connected to the first flip-flop, for transmitting the first intermediate signal based on the reference signal, wherein the set of second flip-flops receives the first intermediate signal from the output terminal of the first flip-flop at the data input terminal and the reference signal at the clock input terminal; and
   an OR gate, connected to the first flip-flop and the set of second flip-flops, for generating a start-up signal based on the first intermediate signal received from the first flip-flop and from the set of second flip-flops.

2. The start-up circuit of claim 1, wherein the first and second comparison signals are pulse signals.

3. The start-up circuit of claim 2, wherein the width of the pulses of the first comparison signal are wider than the width of the pulses of the second comparison signal when the frequency of the reference signal is greater than the frequency of the feedback signal.

4. The start-up circuit of claim 2, wherein a positive edge of the second comparison signal is received at the clock input of the first flip-flop subsequent to the receipt of a positive edge of the first comparison signal at the data input of the first flip-flop when the frequency of the reference signal is greater than the frequency of the feedback signal.

5. The start-up circuit of claim 2, wherein the width of the pulses of the second comparison signal are wider than the width of the pulses of the first comparison signal when the frequency of the feedback signal is greater than the frequency of the reference signal.

6. The start-up circuit of claim 5, wherein the positive edge of the second comparison signal is received at the clock input of the first flip-flop prior to receipt of the positive edge of the first comparison signal at the data input of the first flip-flop when the frequency of the feedback signal is greater than the frequency of the reference signal.

7. A start-up circuit that generates a start-up signal for a Phase Locked Loop (PLL), wherein the PLL includes a phase-frequency detector (PFD) that compares the frequency of a reference signal with the frequency of a feedback signal and generates first and second comparison signals, and wherein the feedback signal is an output signal generated by the PLL, the start-up circuit comprising:
   a first logic gate that receives the first comparison signal from the PFD and the start-up signal and generates a first intermediate signal;
   a second logic gate that receives the second comparison signal from the PFD and the start-up signal and generates a second intermediate signal;
   a first flip-flop connected to the first and second logic gates, wherein the first intermediate signal is provided to the data input of the first flip-flop, the second intermediate signal is provided to the clock input of the first flip-flop, and a first latched intermediate signal (S1) is provided at the data output of the first flip-flop;
   a set of second flip-flops including a plurality of series connected second flip-flops, wherein a first flip-flop in the series receives the first latched intermediate signal (S1) at a data input, and each of the second flip-flops receives the reference signal at a clock input thereof, the second flip-flops outputting second latched intermediate signals (S2 . . . Sn); and
   a third logic gate that receives as inputs the first latched intermediate signal and each of the second latched intermediate signals (S2 . . . Sn) and generates the start-up signal.

8. The start-up circuit of claim 7, wherein the first flip-flop and each of the second flip-flops receives a PWD signal at a reset input thereof.

9. The start-up circuit of claim 7, wherein the first and second logic gates comprise AND gates and the third logic gate comprises an OR gate.

* * * * *